United States Patent [19]

Janes

[11] 3,996,469
[45] Dec. 7, 1976

[54] FLOATING CONVECTION BARRIER FOR EVAPORATION SOURCE

[75] Inventor: George Sargent Janes, Lincoln, Mass.

[73] Assignee: Jersey Nuclear-Avco Isotopes, Inc., Bellevue, Wash.

[22] Filed: Jan. 6, 1975

[21] Appl. No.: 538,881

[52] U.S. Cl. .......................... 250/423 P; 250/281; 219/121 EB
[51] Int. Cl.² ........................................ H01J 39/34
[58] Field of Search ............... 250/281, 282, 423 P; 219/121 EB, 121 EM

[56] References Cited
UNITED STATES PATENTS

| | | | |
|---|---|---|---|
| 3,544,763 | 12/1970 | Geir | 219/271 |
| 3,695,217 | 10/1972 | Jacobsson | 118/49.5 |
| 3,772,519 | 11/1973 | Levy et al. | 250/423 P |

*Primary Examiner*—Alfred E. Smith
*Assistant Examiner*—B. C. Anderson
*Attorney, Agent, or Firm*—Weingarten, Maxham & Schurgin

[57] ABSTRACT

A floating mass or matrix for use in the melt of an electron beam vapor source to permit a wide latitude of evaporant level without necessary replenishment while at the same time reducing convective currents in the melt.

14 Claims, 4 Drawing Figures

FLOATING CONVECTION BARRIER FOR EVAPORATION SOURCE

FIELD OF THE INVENTION

This invention relates to vapor sources and in particular to an electron beam vapor source having a floating matrix in the melt of evaporant.

BACKGROUND OF THE INVENTION

Laser enrichment as described in U.S. Pat. No. 3,772,519 and U.S. patent applications Ser. No. 328,954, filed Feb. 2, 1973 and Ser. No. 469,407, filed May 13, 1974 (incorporated herein by reference) typically employs a flowing uranium vapor which has been generated by electron beam techniques as the environment to which isotopically selective laser radiation is applied to produce excitation of a desired isotope type. Ultimately, ionization of the isotope type and separate collection thereof based upon the ionized charge is achieved in these techniques.

The electron beam vapor source has the advantage of limiting vaporization to a spot or line along the surface of a uranium melt typically contained within a crucible. Since high efficiency is desired for lower power consumption, as well as high evaporant flow rates with state of the art electron beam techniques, it has been suggested that a material be added to the uranium melt to impede the flow of convection currents normally encountered in the melt. Such an impedance barrier provides a great advantage in reducing heat loss through convection.

BRIEF SUMMARY OF THE INVENTION

In a preferred embodiment of the present invention a melt for an electron beam vapor source is described wherein a matrix, applied to the melt to impede the flow of liquefied evaporant, consists of a material having a lower density than the evaporant to float at the surface of the evaporant and extend a predetermined distance below the surface substantially less than the depth of the melt. Thus it is possible to not only impede the flow of convection currents and greatly improve evaporation efficiency in vapor flow rate but to permit operation over a range of melt levels before the matrix begins to "run dry" which occurs when it bottoms out in the crucible.

In particular application to uranium enrichment, a melt consisting of a uranium evaporant and a specifically dimensioned tantalum matrix provides the advantage of a convective heat flow barrier while at the same time permitting a substantial depletion of the uranium evaporant by high vaporization rates before replenishment of the uranium is required.

BRIEF DESCRIPTION OF THE DRAWING

These and other features of the present invention are more fully described below in the detailed description of the preferred embodiment and in the accompanying drawing of which.

DETAILED DESCRIPTION OF THE PREFERRED EMBODIMENT

The present invention contemplates a melt for an electron beam evaporation source having a matrix of particular characteristics to not only impede the flow of convection currents in the melt but to, by floating on the surface, provide a significantly large range of melt levels over which uranium may be successfully evaporated from the melt by the electron beam before the matrix runs dry. In the preferred embodiment, the matrix is structured in a geometric pattern and fabricated from a material having a lower density than the evaporant by such an amount that the matrix structure will float at the surface of the melt without protruding above the surface excessively. A structure for the matrix is chosen to generally maintain at the surface an effective convection barrier while at the same time permitting more slowly moving wicking currents to replenish the evaporant at the surface. It is to be understood, however, that a nonrigid, structured form for the matrix may also be employed. The actual structure of the invention may now be understood by reference to the drawings.

Figure 1:
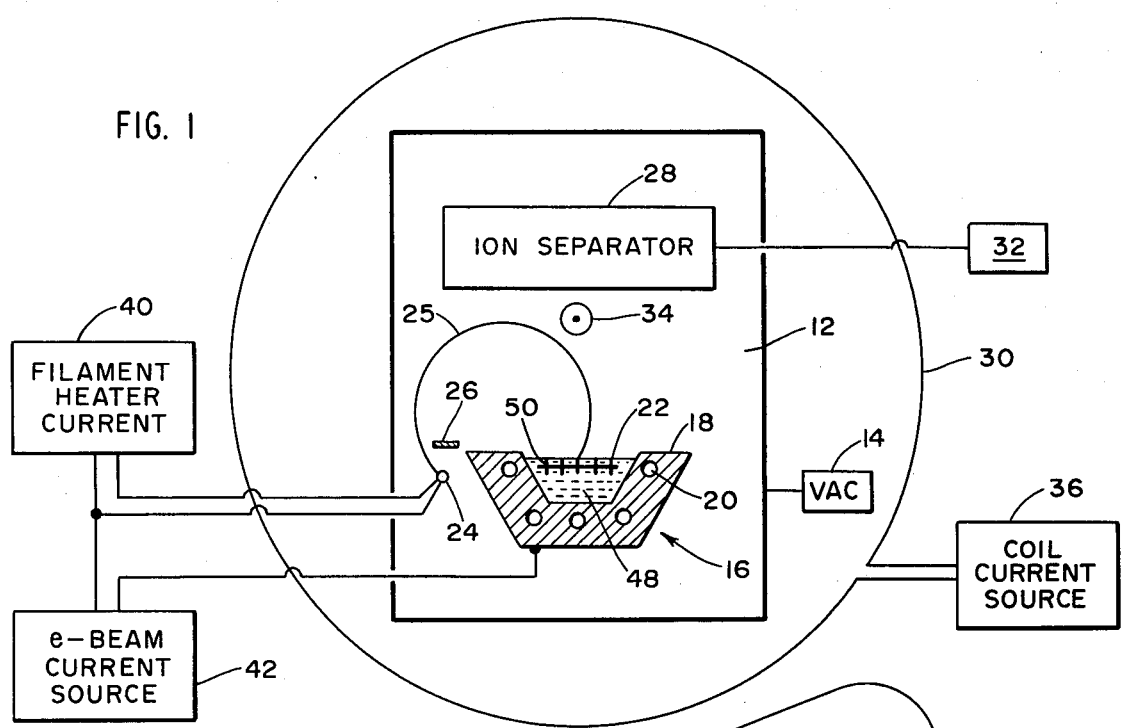
FIG. 1 is a sectional schematic view of uranium enrichment apparatus in which the present invention is useful.

In FIG. 1, there is shown schematically and in section a single chamber 12 for laser enrichment apparatus according to the techniques described in the above-incorporated U.S. Pat. No. 3,772,519 and patent application Ser. No. 328,954, filed Feb. 2, 1973 and Ser. No. 469,407, filed May 13, 1974. The chamber 12 is evacuated by a vacuum system 14 to maintain a low pressure of typically $10^{-5}$ torr in the region above a uranium vapor source 16. The vapor source 16 is shown to comprise a crucible 18 having a plurality of water conducting cooling ports 20 and containing a melt 22 which includes the uranium evaporant. An electron beam is provided from a filament 24 around an anode 26 to the surface of the melt 22 to produce local heating along a line of the surface. The vaporized uranium radially expands above the melt 22 into an ion separator 28 which may be as described in the above-referenced United States patent or applications, and which receives finely tuned laser radiation to produce isotopically selective excitation of typically the U-235 isotope in the uranium vapor and in which crossed magnetic and electric fields from coils 30 and voltage source 32 produce acceleration on the subsequently ionized particles for separate collection thereof on a surface. The coils 30 also produce the magnetic field 34 at an intensity of approximately one to a few hundred gauss in the region of the electron beam from filament 24 to provide beam focusing onto the surface of the melt 22. A coil current source 36 provides the electrical excitation to the coils 30.

The filament 24 is heated by a filament heater current source 40 of typically 1,000 watts capacity, and the current for the electron beam itself is provided from a source 42 which maintains a potential of approximately 30 Kv between the filament 24 and crucible 18.

Figure 2:
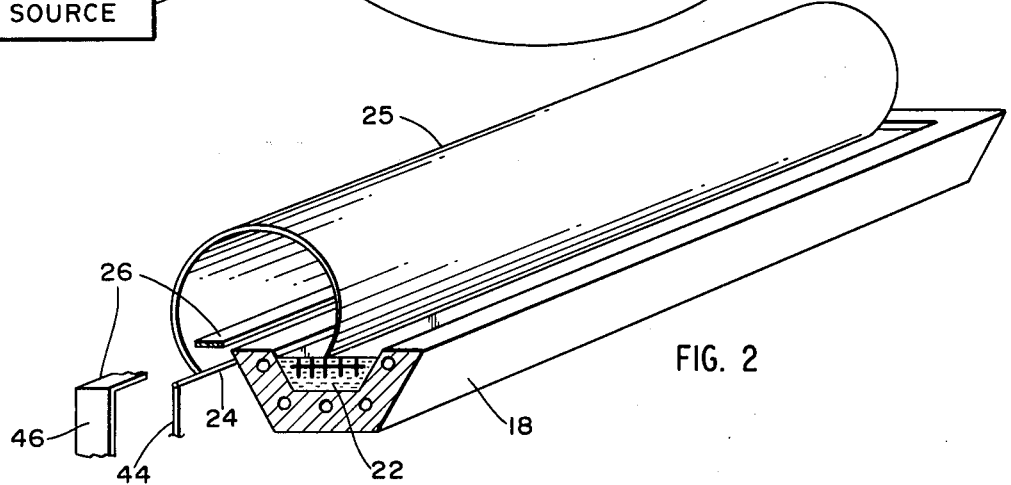
FIG. 2 is a pictorial view, partially in section, of an electron beam evaporation source employing the present invention.

With reference to FIG. 2, the electron beam evaporation source 16 is shown in pictorial and sectional view in a more complete presentation. As shown there, the crucible 18 is elongate in the dimension of filament 24. The filament 24 is shown to be supported at a first end by a strut 44 and the anode 26 supported by a strut 46. Similar struts are provided at the opposite ends of the filament 24 and anode 26 for support and tensioning thereof.

As shown in FIGS. 1 and 2, the melt 22 consists of a uranium supply 48 and a matrix structure or mass 50 which floats at the surface of the melt 22 with relatively slight exposure of the top of the structure 50 above the melt 22. As can be seen in FIGS. 1 and 2, a substantial volume of uranium metal below the matrix 50 is provided in the melt 22 to permit evaporation of a great deal of uranium before the matrix structure 50 "bottoms out" on the crucible 18 and the supply of uranium 48 is no longer sufficient to reach nearly to the top of the structure 50. Between the limits of a full crucible and a crucible depleted of uranium in this manner, the evaporation source may be conveniently operated. An automatic uranium supply feed may be employed to refill the crucible with uranium 48 after a predetermined amount of the supply has been expended. Weight or other detection means may be employed to automatically monitor this condition and activate the uranium feed.

In an exemplary preferred embodiment, the material for the matrix structure 50 comprises tantalum which has the desired advantage of a slightly lower density than the molten uranium, as well as a substantially lower vapor pressure such that negligible percentages of tantalum appear in the uranium vapor. The difference in density between the uranium and tantalum permit the uranium to work very close to the surface of the matrix structure 50. In this case, some tantalum in the structure 50 may be melted at the point of impact of the electron beam creating a slight depression in the structure at that point to expose the relatively pure uranium liquid for evaporation.

The convection currents in the described evaporation source typically flow outward at the surface and inward below the surface. Thus the presence of a flow barrier at the surface is directly effective to block heat loss by this mechanism at the point of maximum convective heat transfer.

The initial melt 22 may be achieved by placing a sufficient quantity of uranium rods or slugs on top of the tantalum matrix structure 50 in the bottom of the crucible 18 and melting the uranium through the matrix structure 50 to form a pool of molten uranium throughout most of the volume of the melt 22 with the matrix structure 50 floating at the surface. The presence of the matrix structure 50 at the point of heating from the electron beam 25 to impede the flow of convection currents to the walls of the crucible 18 provides a substantial increase in evaporation efficiency and vapor flow rate. The limit on the convection currents will also induce solidification of some of the uranium in the melt 22 near the walls of the crucible 18 to limit corrosion of the crucible.

Figure 3A:
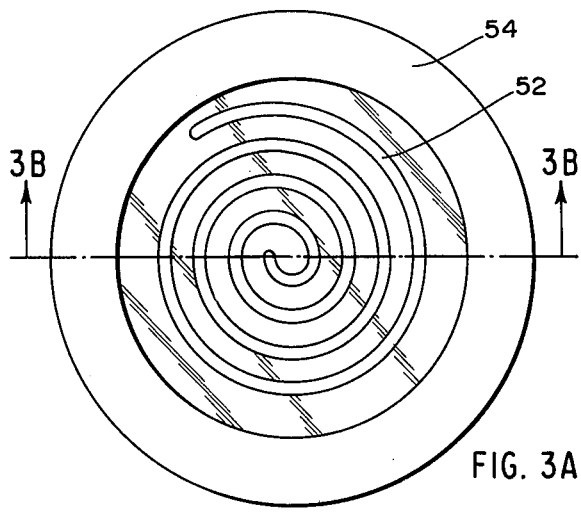
FIGS. 3A–3B are respective top and sectional views of an evaporation melt according to a first experiment illustrating the invention.

The form for the matrix structure 50 may be of any shape, solid or otherwise, which provides a sufficient impedance to the convection flow while at the same time maintains or permits the relatively slower wicking or replenishment currents of uranium into the region of the matrix 50 to permit evaporation from the surface. In one experiment of the concept of the invention illustrated in FIGS. 3A and 3B, the matrix structure consisted of a perforated, coiled band 52 of tantalum approximately 2½ centimeters wide, or deep in the top view of FIG. 3A, and approximately ½ millimeter in thickness. The tantalum matrix 52 was placed in a circular crucible 54 with uranium rods on top and a single electron beam 56 was focused to the center of the crucible to melt the uranium through the matrix 52 into the bottom of the crucible. During operation, the electron beam 56 melted the exposed portions of the tantalum matrix 52 at the point of impact to create a depression as shown at region 58 in FIG. 3B exposing uranium to the surface at that point for efficient evaporation. The melted tantalum did not appear to form a skin over the uranium which would impede uranium vaporization but flowed to the edges to the structure 52. The resulting shape shown in FIG. 3B with a depression toward the center of the matrix 52 provided for a substantial increase in uranium vaporization over a similar vapor source with the matrix 52.

Since the vapor pressure of tantalum is approximately 3 orders of magnitude lower than that of uranium, it generally inhibits vaporization of the tantalum metal as spectrometric analysis of the resulting vapor from the experiment confirmed.

Figure 3B:
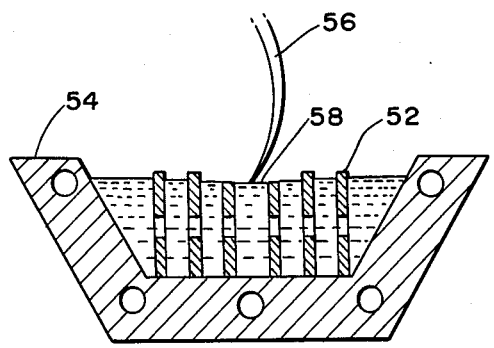

While the experimental matrix 52 in FIG. 3B is extended to the bottom of the crucible, it is preferred for ultimate use that it not do so. In such a preferred form, and as can be seen from the structure illustrated in FIGS. 3A and 3B for the above-described experiment, a substantial volume of uranium could be evaporated from the crucible 54 before the matrix 52 reaches the bottom of the crucible 54 and no longer floats at the surface. Because of the relatively narrow angle of convergence of the electron beam 56 a relatively good focus for the electron beam can be maintained over a substantial distance insuring that loss of effective vaporization from the electron beam over this range is not substantial.

Having described above a preferred embodiment for the present invention, modifications and alternatives to the disclosed structure may be utilized within the spirit of the invention which is to be limited only in the following claims.

What is claimed is:
1. An isotope separator having a vapor source for producing an expanding uranium vapor flow and comprising:
   a water cooled crucible container;
   a melt within said water cooled crucible and including a matrix of a material having a density lower than uranium and a supply of uranium contained within said matrix;
   means for applying an electron beam to the surface of said melt to produce liquefication and vaporization of a portion of the uranium contained within said matrix, said matrix inhibiting the flow of convection currents in the molten uranium thereby to improve vaporization efficiency;
   means for producing isotopically selective photoionization of the expanding uranium vapor; and
   means for separately collecting the ionized uranium particles in said expanding vapor.
2. The separator of claim 1 wherein the matrix material includes tantalum.
3. The separator of claim 1 wherein said matrix had a depression in the region of electron beam impact.
4. An isotope separator having a vapor source for a material having a high temperature of vaporization and comprising:
   a crucible;
   a melt within said crucible including:
      a supply of the material to be vaporized; and a matrix of a material having a density less than the density of said material to be vaporized and having said material to be vaporized within the interstices of the matrix;

means for heating the surface of the melt to provide liquefication of a portion of said material to be vaporized and vaporization thereof; and means for separating isotopes in the vaporized material;

the matrix in the heated melt providing a convection barrier to the liquefied material.

5. The vapor source of claim 4 wherein the material forming said matrix has a vapor pressure substantially lower than the vapor pressure for the material to be vaporized at its temperature of vaporization.

6. The vapor source of claim 5 wherein the material to be vaporized includes elemental uranium and the matrix material includes tantalum.

7. The vapor source of claim 4 wherein said matrix includes a coiled and perforated band of the material forming the matrix.

8. The vapor source of claim 4 wherein said heating means includes means for applying an electron beam to the surface of said melt in an intensity sufficient to vaporize the material to be vaporized.

9. The vapor source of claim 8 wherein said matrix has a depression in the region of electron beam impact.

10. The vapor source of claim 4 wherein said crucible has an elongated trough shape.

11. The vapor source of claim 4 wherein said matrix extends only slightly above the surface of said melt to impede outwardly flowing surface convection currents in the melt.

12. The vapor source of claim 4 wherein the vaporized material includes uranium and said means for separating isotopes comprises:

means for producing isotopically selective photoionization of uranium particles of one isotope type in the vapor; and means for accelerating the ionized particles in the vapor.

13. The vapor source of claim 12 wherein said means for producing isotopically selective ionization includes laser means for producing isotopically selective photoexcitation.

14. The vapor source of claim 13 wherein said accelerating means includes means for applying magnetohydrodynamic forces to the ionized particles.

* * * * *